United States Patent
Roesner et al.

(10) Patent No.: US 6,255,684 B1
(45) Date of Patent: Jul. 3, 2001

(54) DRAM CELL CONFIGURATION AND METHOD FOR ITS PRODUCTION

(75) Inventors: Wolfgang Roesner, München; Lothar Risch, Neubiberg; Franz Hofmann, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/071,798

(22) Filed: May 4, 1998

(30) Foreign Application Priority Data

May 2, 1997 (DE) ............................................. 197 18 721

(51) Int. Cl.[7] ...................... H01L 27/108; H01L 29/76; H01L 29/74; H01L 31/119
(52) U.S. Cl. ...................... 257/302; 257/301; 257/304; 257/305
(58) Field of Search ................................ 257/302, 301, 257/304, 305; 438/242, 241, 270

(56) References Cited

U.S. PATENT DOCUMENTS

| 5,376,575 | 12/1994 | Kim et al. | 437/52 |
| 5,477,071 | 12/1995 | Hamamoto et al. | 257/302 |
| 5,519,236 | 5/1996 | Ozaki | 257/302 |
| 5,909,618 | * 6/1999 | Forbes et al. | 438/242 |
| 5,994,735 | * 11/1999 | Maeda et al. | 257/329 |
| 6,034,389 | * 3/2000 | Burns, Jr. et al. | 257/301 |

OTHER PUBLICATIONS

"A Deep Trenched Capacitor Technology for 4 Mbit DRAMs", Proc. Intern. Electronic Devices and Materials IEDM 85, p. 702.

* cited by examiner

Primary Examiner—Steven Loke
Assistant Examiner—Douglas W. Owens
(74) Attorney, Agent, or Firm—Herbert L. Lerner; Laurenc A. Greenberg; Werner H. Stemer

(57) ABSTRACT

A DRAM cell configuration includes a vertical MOS transistor per memory cell. First source/drain regions of the transistor each belong to two adjacent transistors and adjoin a bit line. Second source/drain regions of the transistor are connected to a storage node. A gate electrode of the transistor has exactly two sides adjoined by a gate oxide. The DRAM cell configuration can be produced by using three masks, with a memory cell area of 4 $F^2$. F is a minimum structure size which can be produced by using the respective technology.

7 Claims, 5 Drawing Sheets

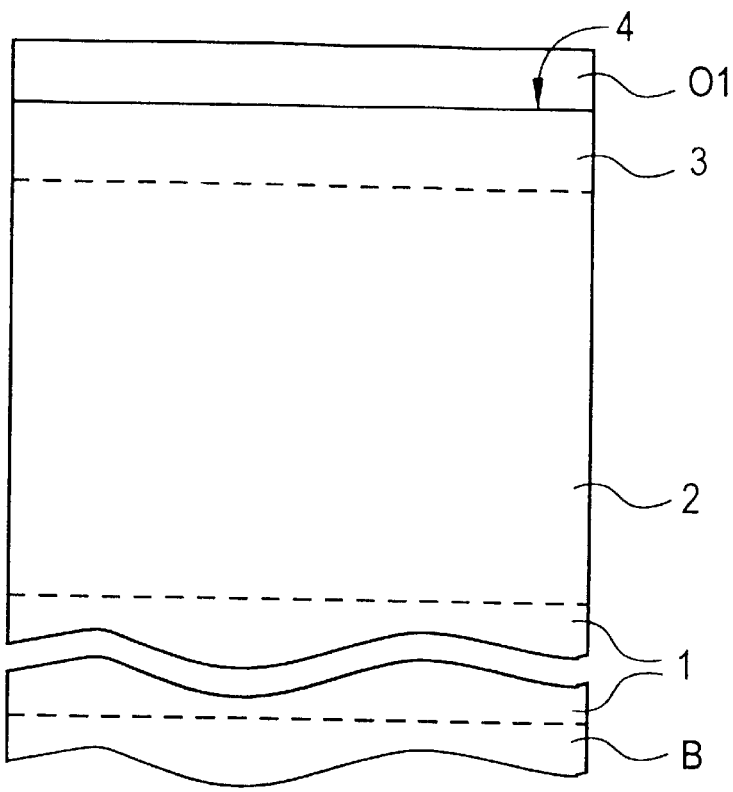
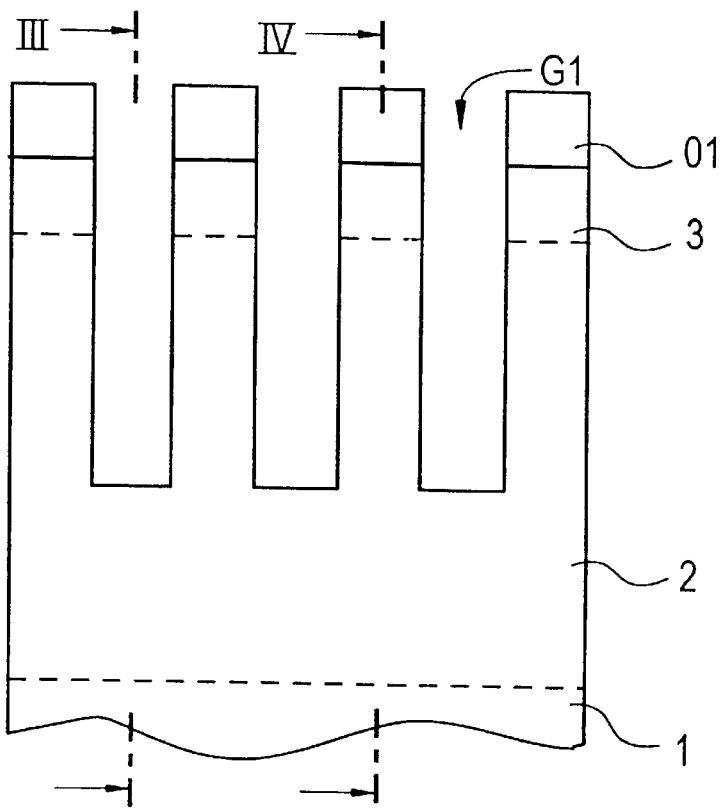

DRAM CELL CONFIGURATION AND METHOD FOR ITS PRODUCTION

BACKGROUND OF THE INVENTION

FIELD OF THE INVENTION

The invention relates to a DRAM cell configuration and a method for its production.

In DRAM cell configurations, that is to say memory cell configurations with dynamic random access, use is made almost exclusively of so-called single-transistor memory cells. A single-transistor memory cell includes a read-out transistor and a storage capacitor. The information is stored in the storage capacitor in the form of an electric charge, which represents a logic value, 0 or 1. That information can be read out through a bit line by driving a readout transistor over a word line.

Since storage density increases from memory generation to memory generation, the required area of the single-transistor memory cell must be reduced from generation to generation. Since limits are imposed on the reduction of the structure sizes by a minimum structure size F which can be produced by using the respective technology, that is also associated with an alteration of the single-transistor memory cell. Thus, up until the 1 Mbit generation, both the read-out transistor and the storage capacitor were realized as planar components. Starting with the 4 Mbit memory generation, a further reduction in area had to be effected through the use of a three-dimensional configuration of the read-out transistor and the storage capacitor.

One possibility is to realize the storage capacitor in a trench rather than in a planar manner (see, for example, a paper by K. Yamada et al. entitled "A Deep Trenched Capacitor Technology for 4 Mbit DRAMs", in Proc. Intern. Electronic Devices and Materials IEDM 85, page 702).

Another possibility is to use vertical MOS transistors as described in U.S. Pat. No. 5,376,575, for example. In the production method described therein, each vertical MOS transistor encompasses two opposite sides of a trench along which a bit line runs. Doped regions which act as a drain region of the MOS transistors are provided in the upper area of the sides. The surface of the sides is provided with gate oxide. A gate electrode is provided which covers the opposite surface of the gate oxide. The gate electrode is insulated from an inferior, buried bit line and from a superior storage node, in each case by an insulating layer. Shallow trenches which run transversely to the bit lines and in which word lines running transversely to the bit lines are disposed are provided in the surface of the substrate. The word lines laterally adjoin the gate electrode and are thus connected thereto. The smallest memory cell area that can be achieved using that method is 6 $F^2$.

German Published, Non-Prosecuted Patent Application DE 38 44 120 A1 discloses a DRAM configuration in which trenches are provided in a semiconductor substrate. A drain region is provided at the bottom of the trench. A source region is provided at the surface of the substrate. The side walls of the trench are provided with gate oxide and a gate electrode and act as a channel region. The gate electrodes are embedded in an insulation layer in which a contact hole reaches down to the surface of the drain region located at the bottom of the trench and is provided with an electrode. A capacitor is provided laterally with respect to the trench on the surface of the semiconductor substrate. The lateral configuration of the capacitor and the transistor results in an increased area requirement of the memory cell.

A DRAM cell configuration in which read-out transistors are constructed as vertical transistors is mentioned in a paper by P. Chatterjee et al. in IEDM 86 pages 128–131. A read-out transistor has a first source/drain region which annularly-forms a ring surrounds a gate electrode and is part of a bit line. A second source/drain region of the read-out transistor is produced by outdiffusion of dopant of a storage node which is realized in a depression and is disposed underneath the gate electrode. Word lines, which are in part composed of gate electrodes, run above the bit lines. The read-out transistor encompasses at least sides of the gate electrode which are parallel to the bit lines. The area of a memory cell is 9 $F^2$.

German Patent DE 195 19 160 C1 proposes a DRAM cell configuration which includes one vertical MOS transistor per memory cell. A first source/drain region of the transistor is connected to a storage node of a storage capacitor, a channel region of the transistor is annularly enclosed by a gate electrode, and a second source-drain region of the transistor is connected to a buried bit line. The storage capacitor is either a planar capacitor or a stacked capacitor. The DRAM cell configuration can be produced with a memory cell area of 4 $F^2$.

The area of a memory cell of a DRAM in the 1 Gbit generation is intended to be only about 0.2 $\mu m^2$. In that case, the storage capacitor must have a capacitance of 20 to 30 fF. Such a capacitance can only be achieved at great expense given a cell area of the kind that is available in the 1 Gbit generation, both in the case of planar capacitors and in the case of stacked capacitors: in the case of planar capacitors, it is necessary to apply a capacitor dielectric made of a material having a particularly high dielectric constant. Since the known ferroelectric and paraelectric materials which are suitable therefor contaminate the apparatuses which are usually used to produce DRAMs, the DRAM to be produced must be placed into an additional second apparatus for the application of the dielectric. In the case of the stacked capacitor, a relatively complicated polysilicon structure is required in order to enlarge the area and thus the capacitance of the storage capacitor, which structure is all the more difficult to produce as the cell area becomes smaller.

SUMMARY OF THE INVENTION

It is accordingly an object of the invention to provide a DRAM cell configuration and a method for its production, which overcome the hereinafore-mentioned disadvantages of the heretofore-known devices and methods of this general type, and in which the DRAM cell configuration has single-transistor memory cells as its memory cells and can be produced with the requisite component density for the 1 Gbit generation.

With the foregoing and other objects in view there is provided, in accordance with the invention, a DRAM cell configuration, comprising a substrate of semiconductor material; memory cells each including a read-out transistor integrated in the substrate as a vertical MOS transistor, and a storage capacitor having a storage node; a bit line and a word line; the vertical MOS transistor having a gate electrode and two first source/drain regions and second source/drain regions, the first source/drain regions disposed separately or isolated one after the other along the bit line, adjoining the bit line and each belonging to a further, adjacent vertical MOS transistor, and the second source/drain regions connected to the storage node; a gate oxide adjoining exactly two opposite sides, surfaces or flanks of the gate electrode; two channel regions each adjoining the gate oxide; the gate electrode disposed between the two channel regions; the gate electrodes of adjacent vertical MOS transistors along the word line connected to one another; and the gate electrode and the storage node disposed one under the other.

With the objects of the invention in view, there is also provided a method for the production of a DRAM cell configuration, which comprises producing memory cells each having a read-out transistor and a storage capacitor with a storage node; producing bit and word lines; forming the read-out transistor as a vertical MOS transistor integrated in a substrate of semiconductor material; providing the MOS transistor with two first source/drain regions each belonging to a further, adjacent vertical MOS transistor, disposed separately or isolated one after the other along the bit line and adjoining the bit line, two second source/drain regions each connected to the storage node, and a gate electrode; producing a gate oxide adjoining exactly two opposite sides, surfaces or flanks of the gate electrode; producing two channel regions each adjoining the gate oxide; producing the gate electrode between the two channel regions; electrically connecting the gate electrodes of adjacent MOS transistors along the word line; and placing the gate electrode and the storage node one under the other.

In the DRAM cell configuration according to the invention, single-transistor memory cells are provided in which the read-out transistor is constructed as a vertical MOS transistor. Each MOS transistor encompasses two opposite sides of a gate electrode which run parallel to the word line and adjoin a gate oxide. The MOS transistor has exactly two first source/drain regions, which are disposed spatially separated along a bit line through which they are connected. Each first source/drain region belongs to two neighboring or adjacent transistors along the bit line, which leads to a small cell area.

It is advantageous to realize the storage capacitor in a trench. The outlay for producing such capacitors for the 1 Gbit generation is distinctly less than that for producing planar capacitors or stacked capacitors.

If elements are provided in a self-aligned manner, that is to say without using masks to be aligned, it is possible to achieve a reduction in the cell area since it is not necessary to take alignment tolerances into account. According to one embodiment, the storage nodes are provided in a self-aligned manner under the word lines and are insulated from neighboring storage nodes. In addition, the contacts of the first source/drain regions to the bit lines are opened in a self-aligned manner. This permits the production of cell areas of 4 $F^2$ with just 3 masks.

Second source/drain regions of the MOS transistor are connected to a storage node. They are preferably produced by outdiffusion of dopant from the storage node into a suitable structured layer. As a result, the storage nodes are connected in a self-aligned manner to the second source/drain regions and the cell area is kept small. A junction depth, that is to say the path of minimal separation between source and drain perpendicular to the current flow and perpendicular to the gate electrode, is also kept small, which has a positive influence on short-channel effects, such as punch-through.

It lies within the scope of the invention to construct the gate electrode as part of the word line, which reduces the number of necessary process steps and effects a self-aligned connection between the gate electrode and the word line.

When capacitors realized in trenches are used, it is advantageous to provide a further layer doped by a conductivity type opposite to the conductivity type of the capacitor plate, underneath the layer which serves as a capacitor plate. The substrate is thereby electrically insulated from the capacitor plate, which can be connected separately to a potential.

According to one embodiment, in order not to etch $SiO_2$ too deeply when opening the contacts of the first source/drain regions to the bit lines, which can lead to a short circuit between the word lines and the bit lines, it is advantageous to apply a layer of silicon nitride to the substrate at the beginning of the DRAM production. During the etching of $SiO_2$, the uncovering of the layer of silicon nitride supplies an end-point signal for the etching as a result of a change of physical conditions, such as the gas composition, for instance. In order to avoid superficial damage to the substrate by silicon nitride, it is advantageous to apply a thin $SiO_2$ layer before the silicon nitride layer is produced.

Other features which are considered as characteristic for the invention are set forth in the appended claims.

Although the invention is illustrated and described herein as embodied in a DRAM cell configuration and a method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a fragmentary, diagrammatic, sectional view perpendicular to a surface of a first substrate with a doped region above which three layers of semiconductor material are disposed, with a first $SiO_2$ layer applied above them;

FIG. 2 is a fragmentary, sectional view according to FIG. 1 after the production of first trenches;

DESCRIPTION OF THE PREFERRED EMBODIMENTS

Referring now to the figures of the drawings in detail and first, particularly, to FIG. 1 thereof, there is seen a starting material which is a substrate that is made, for example, of monocrystalline silicon which is doped in a region B of a first conductivity type. The region B has, for example, a p-type doping with a dopant concentration of approximately $3*10^{16}$ cm$^{-3}$. The region B is provided with a first layer 1 which is doped by a second conductivity type, opposite to the first conductivity type having a dopant concentration of approximately $10^{20}$ cm$^{-3}$, with a second layer 2, which is doped by the first conductivity type having a dopant concentration of approximately $3*10^{17}$ cm$^{-3}$, and with a third layer 3, which is doped by the second conductivity type having a dopant concentration of approximately $10^{21}$ cm$^{-3}$. The first layer 1, the second layer 2 and the third layer 3 are produced by epitaxial growth, for example. The third layer 3 forms a surface 4 of the substrate. The first layer 1 has a thickness of approximately 9 μm, the second layer 2 has a thickness of approximately 1 μm and the third layer 3 has a thickness of approximately 200 nm.

A first SiO$_2$ layer O1 having a thickness of approximately 150 nm is deposited on the surface 4, as is seen in FIG. 1, in a TEOS process. The first SiO$_2$ layer O1 is structured with the aid of a first non-illustrated photoresist mask, and parts of the surface 4 are uncovered in order to be able to produce first trenches G1.

After the first photoresist mask has been removed, the first trenches G1 are etched selectively with respect to SiO$_2$, as is seen in FIG. 2, in an anisotropic dry etching process. HBr, NF$_3$, He and O$_2$ are suitable, for example, for an etching process in which silicon is attacked selectively with respect to SiO$_2$. The first trenches G1 are produced with a depth of approximately 800 nm and reach down into the second layer 2. The first trenches G1 have a strip-shaped cross-section parallel to the surface 4 and run substantially parallel over the entire cell array. The first trenches G1 have a width of approximately 200 nm and a length of approximately 50 μm. A distance between the centers of neighboring first trenches G1 is approximately 400 nm, which corresponds to twice a minimum structure size F=200 nm in the technology used.

Figure 4:
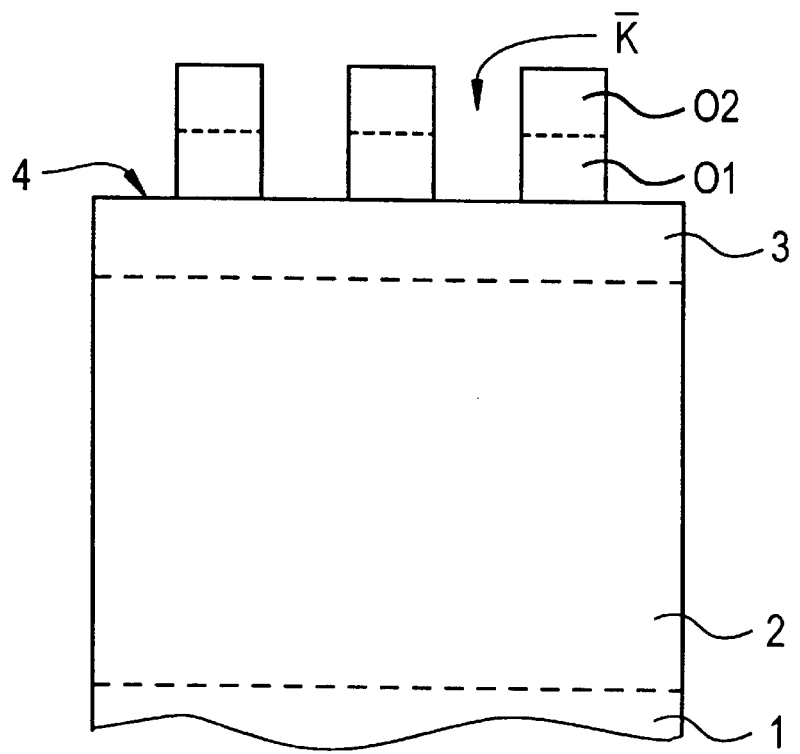
FIG. 4 is a fragmentary, sectional view taken along the line IV—IV of FIG. 2, in the direction of the arrows.

As is seen in FIG. 4, the first trenches G1 are filled by depositing a second SiO$_2$ layer O2 having a thickness of 150 nm, for example, in a TEOS process. The surface 4 is covered by parts of the first SiO$_2$ layer O1 and by parts of the second SiO$_2$ layer O2, that is to say by a total of 300 nm of SiO$_2$.

Figure 3:
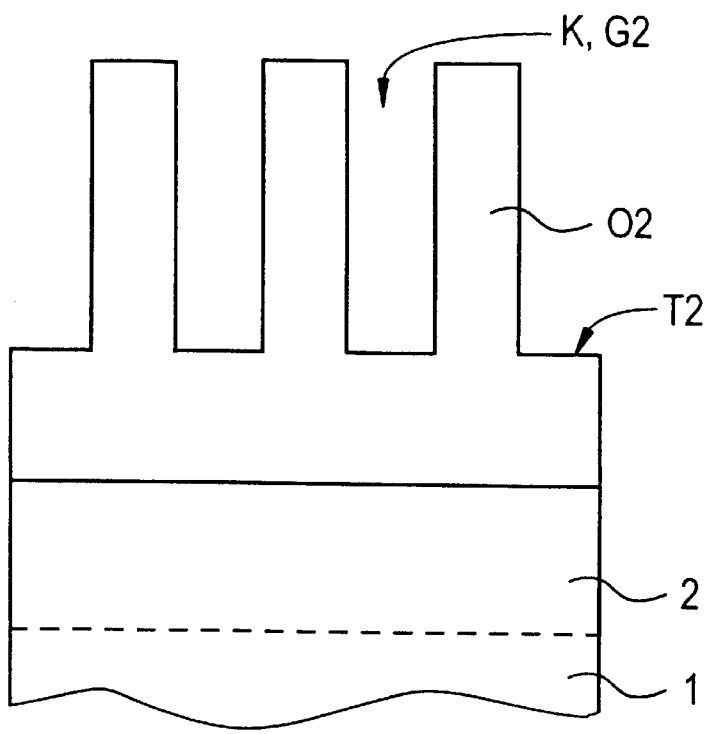
FIG. 3 is a fragmentary, sectional view taken along the line III—III of FIG. 2, in the direction of the arrows, along a first trench after the formation of a second $SiO_2$ layer which fills the first trenches, and after the etching of $SiO_2$ for the purpose of producing second trenches, wherein this section retains its appearance even after process steps relating to FIGS. 5 and 6.

As is seen in FIG. 3, in order to form second trenches G2, SiO$_2$ is etched selectively with respect to silicon through the use of an isotropic dry etching, with the aid of a second photoresist mask down to a second depth T2, which lies above an interface between the first layer 1 and the second layer 2 and below an interface between the second layer 2 and the third layer 3 and is approximately 400 nm from the surface 4. In this case, parts of the surface 4, which is not attacked due to the selectivity of the etching, are uncovered, as is seen in FIG. 4. CHF$_3$, CF$_4$ and/or Ar, for example, are suitable for an etching process in which SiO$_2$ is attacked selectively with respect to silicon.

Figure 5:
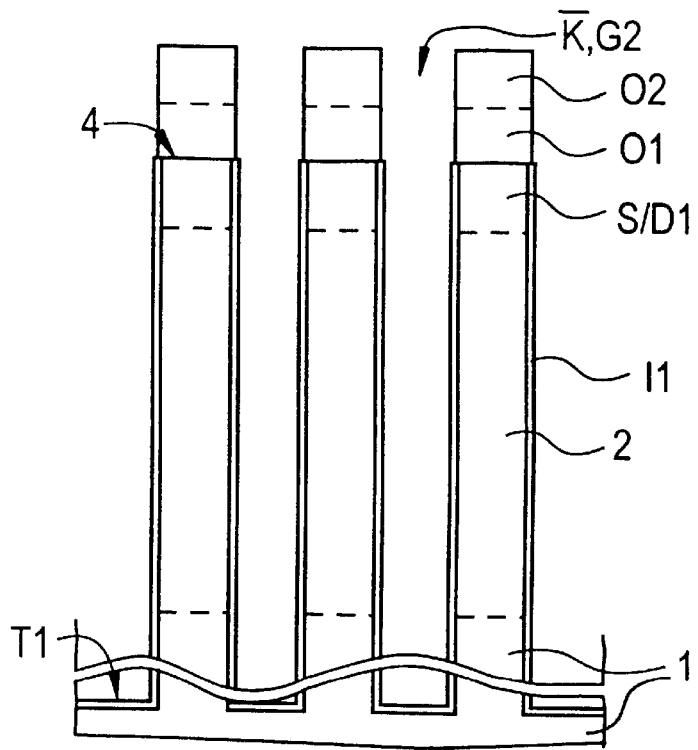
FIG. 5 is a fragmentary, sectional view showing the section of FIG. 4 after the etching of semiconductor material which concludes the formation of the second trenches, and after the production of a first insulation structure.

As is seen in FIG. 5, silicon is subsequently etched selectively with respect to SiO$_2$ down to a first depth T1 within the first layer 1. The first depth T1 lies 10 μm, for example, below the surface 4. The second trenches G2 that have been produced run e.g. perpendicularly to the first trenches G1. The second trenches G2 have a width of approximately 200 nm and a length of approximately 50 μm. A distance between the centers of neighboring second trenches G2 is approximately 400 nm. The first trenches G1, which are partially filled with SiO$_2$, and the second trenches G2 cross at crossover regions K. The second trenches G2 have the second depth T2 at the crossover regions K seen in FIG. 3. The second trenches G2 have the first depth T1 in regions $\overline{K}$ located between the crossover regions K, as is seen in FIG. 5. The second trenches G2 thus cut through the third layer 3 and the second layer 2 in the regions $\overline{K}$ located between the crossover regions K. The second trenches G2 have a strip-shaped cross-section parallel to the surface 4 and run substantially parallel. Remaining parts of the third layer 3 which are bounded by the first trenches G1 and the second trenches G2 are suitable as first source/drain regions S/D1.

Figure 6:
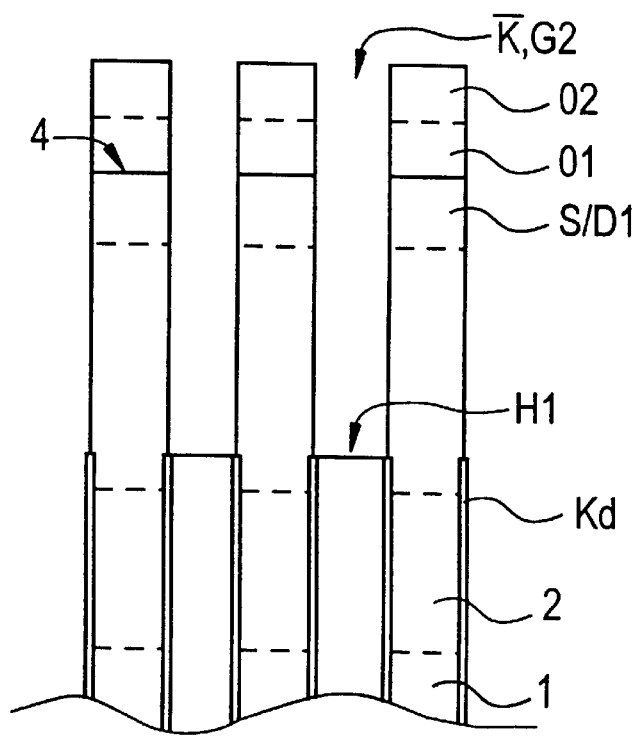
FIG. 6 is a fragmentary, sectional view showing the section of FIG. 5 after the second trenches have been filled with semiconductor material up to a first level and after the removal of parts of the first insulation structure, thereby producing capacitor dielectrics.

A first insulation structure I1 is produced by thermal oxidation of those areas of semiconductor material which adjoin the second trenches G2, as is seen in see FIG. 5. The second trenches G2 are subsequently filled by depositing semiconductor material which is doped by the second conductivity type with a dopant concentration of approximately $10^{21}$ cm$^{-3}$. The thickness of the applied semiconductor material is approximately 200 nm. Silicon is subsequently etched selectively with respect to SiO$_2$, in such a way that the second trenches G2 are filled with semiconductor material up to a first level H1 in the regions $\overline{K}$ located between the crossover regions K. The first level H1 is situated above an interface between the first layer 1 and second layer 2 and below a second depth T2. The first level H1 lies approximately 600 nm below the surface 4. Parts of the first insulation structure I1 which are uncovered as a result are removed by a wet etching process with HF. Remaining parts of the first insulation structure I1 are suitable as capacitor dielectrics Kd, as is seen in FIG. 6.

The second trenches G2 are subsequently filled by depositing semiconductor material which is doped by the second conductivity type with a dopant concentration of approximately $10^{21}$ cm$^{-3}$. The thickness of the deposited semiconductor material is approximately 200 nm. Silicon is subsequently etched selectively with respect to SiO$_2$, in such a way that the second trenches G2 are filled with semiconductor material up to a second level H2, which lies above the first level H1 and below the second depth T2, in the regions $\overline{K}$ located between the crossover regions K. The second level H2 lies approximately 100 nm above the first level H1. The semiconductor material up to the second level H2 in the regions $\overline{K}$ of the second trenches G2 which are located between the crossover regions K is suitable as storage nodes Sp. Accordingly, the storage nodes Sp reach from the second layer 2 as far as into the first layer 1.

Figure 7:
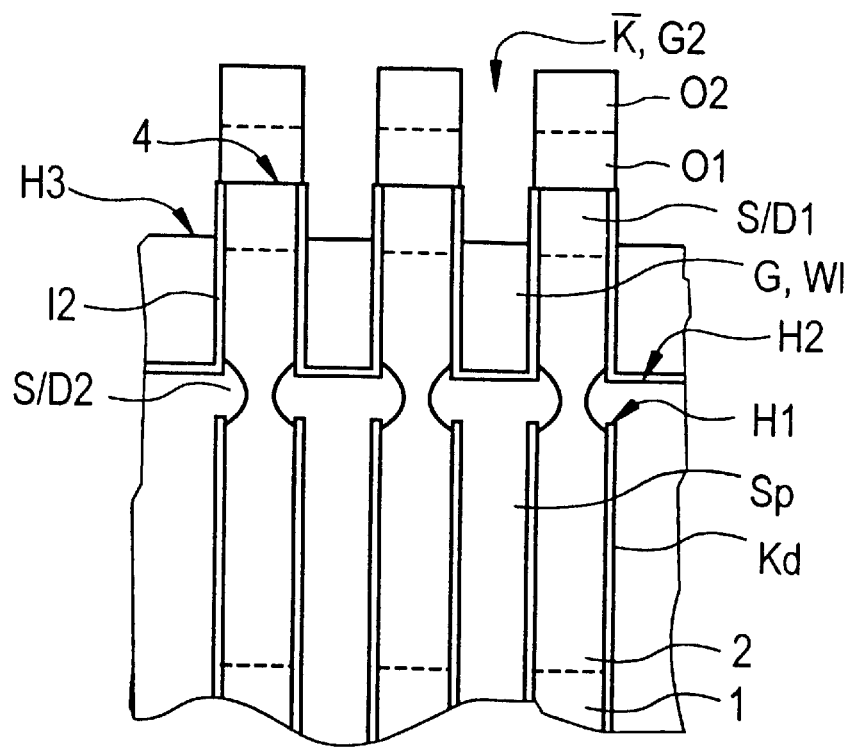
FIG. 7 is a fragmentary, sectional view showing the section of FIG. 6 after the production of second source/drain regions, gate oxides, word lines and gate electrodes.

Dopant diffuses out of the storage nodes into the second layer 2 by using an RTP process. Resultant regions doped by the second conductivity type are suitable as second source/drain regions S/D2, which are seen in FIG. 7.

A gate oxide I2 is produced within the second trenches G2 through the use of thermal oxidation, for example. Conductive material, which contains e.g. polysilicon and/or metal silicide, is subsequently deposited in order to fill the second trenches G2. The thickness of the deposited conductive material is approximately 200 nm. The conductive material is etched selectively with respect to SiO$_2$, in such a way that the second trenches G2 are filled with conductive material up to a third level H3, which lies above the interface between the second layer 2 and the third layer 3 and below the surface 4, in the regions $\overline{K}$ located between the crossover regions K, as is seen in FIG. 7. The third level H3 lies approximately 150 nm below the surface 4. The deposited conductive material forms word lines Wl which are suitable as gate electrodes G in the regions $\overline{K}$ located between the crossover regions K. The gate electrodes G are thus produced in a self-aligned manner above the storage nodes Sp.

The second trenches G2 are filled by depositing $SiO_2$, in a TEOS process. The thickness of the deposited $SiO_2$ is approximately 200 nm. $SiO_2$ is subsequently etched selectively with respect to silicon until the surface 4 is uncovered. The first $SiO_2$ layer O1 and the second $SiO_2$ layer O2 are completely removed by this step. Since only the first source/drain regions S/D1 and insulating materials adjoin a section along the surface 4, contacts to the first source/drain regions S/D1 are thereby opened in a self-aligned manner.

Figure 8:
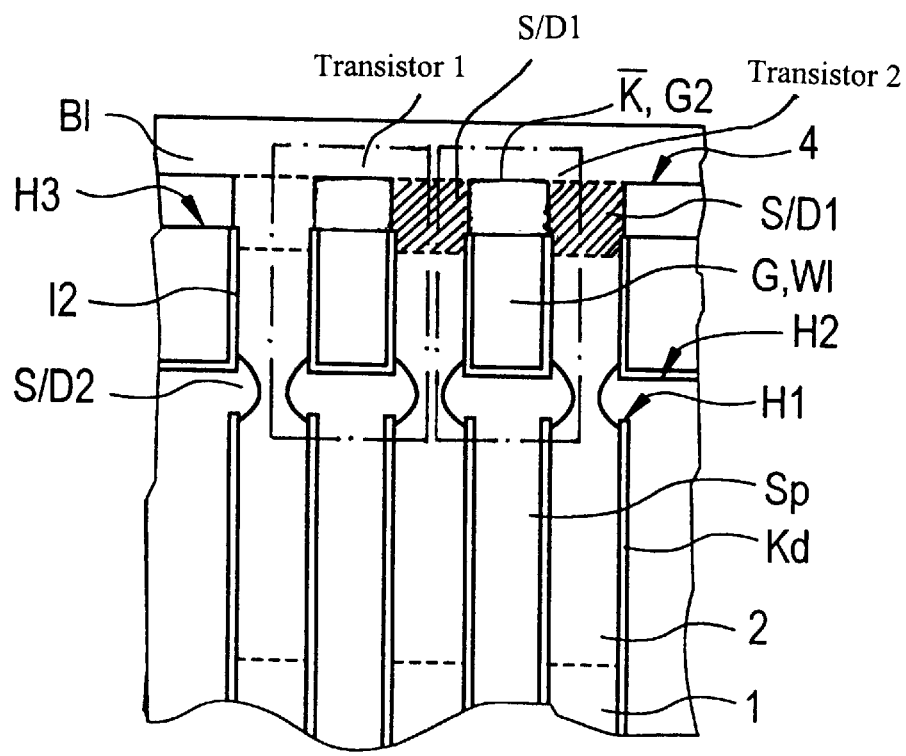
FIG. 8 is a fragmentary, sectional view showing the section of FIG. 7 after the production of bit lines.
Figure 9:
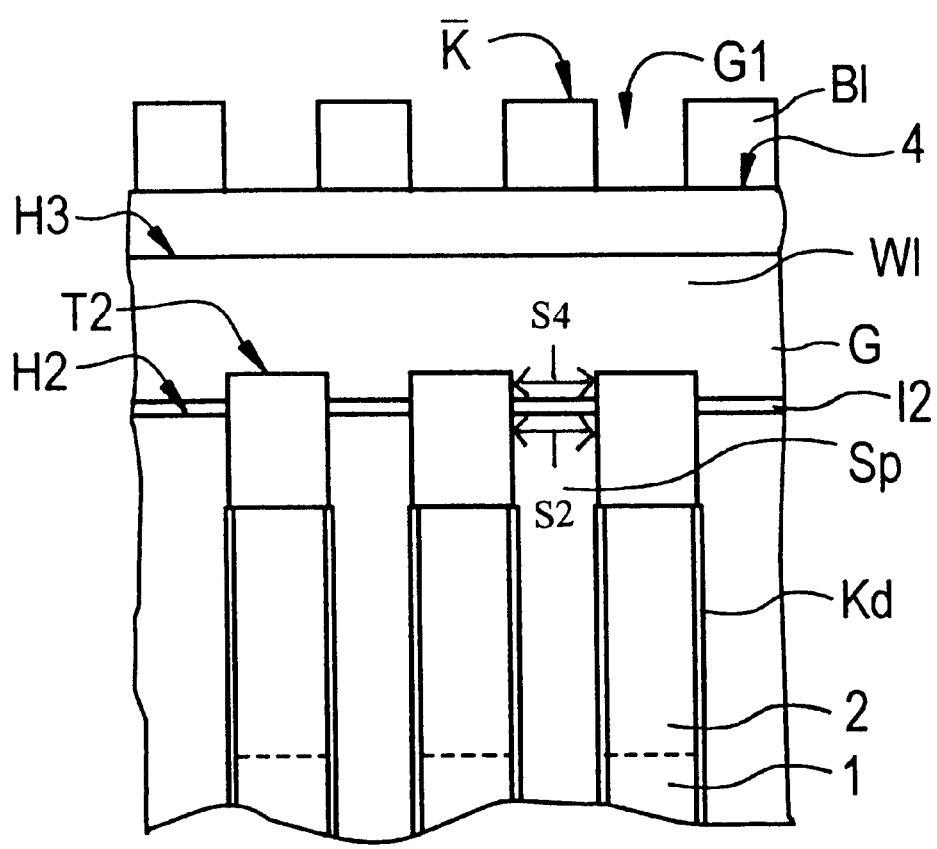
FIG. 9 is a fragmentary, sectional view showing the section of FIG. 2 along a second trench after the production of the bit lines.

Bit lines Bl are produced by depositing and structuring conductive material, with the aid of a third photoresist mask having a form which corresponds to that of the first photoresist mask. The bit lines Bl are disposed in such a way that they overlap the first source/drain regions S/D1, as is seen in FIGS. 8 and 9. The conductive material contains e.g. polysilicon, metal silicide and/or tungsten.

Each MOS transistor includes a gate electrode G, which is part of a word line Wl, two first source/drain regions S/D1, which have been produced by structuring the third layer 3 and overlap a bit line Bl, two channel regions which run perpendicular to the surface 4, are located within the second layer 2 and are each adjoined by a gate oxide, and two second source/drain regions S/D2, which have been produced by outdiffusion of dopant from a storage node Sp into the second layer 2 and are connected to the storage node Sp, as is seen in FIG. 8. $SiO_2$ in the first trenches G1 insulates neighboring transistors from one another in the word line direction, as well as word lines Wl from bit lines Bl. The storage nodes Sp are disposed underneath the gate electrodes G.

Instead of the first $SiO_2$ layer O1, it is possible to form a layer on the surface 4 including e.g. three partial layers, of which a middle partial layer having a thickness of approximately 80 nm contains silicon nitride. A lower partial layer made of $SiO_2$ and having a thickness of approximately 20 nm, which is intended to prevent superficial damage to the substrate by silicon nitride, is produced through the use of thermal oxidation. An upper partial layer made of $SiO_2$ and having a thickness of approximately 50 nm is produced in a TEOS process, for example. It is thus necessary to etch not only $SiO_2$ but also silicon nitride in each etching process which uncovers parts of the surface 4. This alternative reduces the risk of excessively deep etching being effected during the opening of the contacts of the first source/drain regions S/D1, which would lead to a short circuit between word lines Wl and bit lines Bl seen in FIG. 9.

Many variations of the exemplary embodiment which likewise lie within the scope of the invention are conceivable. In particular, the dimensions of the layers and trenches that are presented can be adapted in any desired way to the respective requirements. The same also applies to the dopant concentrations proposed. Structures and layers made of $SiO_2$ can be produced by thermal oxidation or by a TEOS process.

We claim:
1. A DRAM cell configuration, comprising:
   a substrate of semiconductor material;
   memory cells each including a read-out transistor integrated in said substrate as a vertical MOS transistor, and a storage capacitor having a storage node;
   a bit line and a word line;
   said vertical MOS transistor having a gate electrode, two first source/drain regions, and two second source/drain regions; said first source/drain regions disposed separately one after the other along said bit line, adjoining said bit line and each of said two first source/drain regions belonging to a further, adjacent vertical MOS transistor; and said second source/drain regions connected to said storage node;
   a gate oxide adjoining exactly two opposite sides of said gate electrode;
   two channel regions each adjoining said gate oxide;
   said gate electrode disposed between said two channel regions;
   said gate electrodes of adjacent vertical MOS transistors along said word line connected to one another; and
   said gate electrode and said storage node disposed one under the other.
2. The DRAM cell configuration according to claim 1, wherein said storage capacitor has a capacitor dielectric, and at least part of said capacitor dielectric is disposed radially further outward, relative to a vertical axis running through said gate electrode, than part of said storage node adjoining it.
3. The DRAM cell configuration according to claim 1, including a trench in which said gate electrode and said storage node are disposed.
4. The DRAM cell configuration according to claim 1, wherein said substrate has a surface, said gate electrode has a cross-section parallel to said surface, said storage node has a cross-section parallel to said surface, and dimensions of said cross-section of said gate electrode substantially are congruent to dimensions of said cross-section of said storage node.
5. The DRAM cell configuration according to claim 4, wherein:
   said storage node is disposed underneath said gate electrode;
   said storage node has sides parallel to said word line and sides parallel to said bit line;
   said storage capacitor has a capacitor dielectric, part of said capacitor dielectric is disposed on said sides parallel to said word line and is interrupted for connecting said storage node to said second source/drain regions; and
   insulating material is disposed on said sides parallel to said bit line and encompasses a different part of said capacitor dielectric.
6. The DRAM cell configuration according to claim 1, wherein said bit line runs above said word line, and said word line is disposed at a level of said gate electrode.
7. The DRAM cell configuration according to claim 1, wherein said first and second source/drain regions are doped regions in said substrate; and said bit line and said word line contain at least one material selected from the group consisting of polysilicon, metal silicide and tungsten.

* * * * *